US008643076B2

(12) United States Patent
Seo et al.

(10) Patent No.: US 8,643,076 B2
(45) Date of Patent: Feb. 4, 2014

(54) NON-VOLATILE MEMORY DEVICE AND METHOD FOR FABRICATING THE SAME (75) Inventors: Dae-Young Seo, Gyeonggi-do (KR); Jong-Won Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 53 days.

(21) Appl. No.: 13/304,591

(22) Filed: Nov. 25, 2011

(65) Prior Publication Data
US 2012/0286345 A1 Nov. 15, 2012

(30) Foreign Application Priority Data

May 11, 2011 (KR) .................. 10-2011-0044147

(51) Int. Cl.
*H01L 29/788* (2006.01)
*H01L 21/28* (2006.01)
(52) U.S. Cl.
USPC .. 257/315; 257/324; 257/E29.3; 257/E29.19; 438/591; 438/593
(58) Field of Classification Search
USPC ......... 257/315, 324, E29.3, E21.19; 438/591, 438/593
See application file for complete search history.

(56) References Cited

U.S. PATENT DOCUMENTS

2008/0099819 A1* 5/2008 Kito et al. ..................... 257/315

FOREIGN PATENT DOCUMENTS

KR 1020080034816 4/2008

OTHER PUBLICATIONS

Office Action issued by the Korean Intellectual Property Office on Jul. 17, 2012.

* cited by examiner

*Primary Examiner* — Whitney T Moore
(74) *Attorney, Agent, or Firm* — IP & T Group LLP (57) ABSTRACT A non-volatile memory device includes a substrate including a cell region and a peripheral circuit region, a first insulation layer formed over the substrate to cover the peripheral circuit region thereof, and interlayer dielectric patterns and first conductive patterns alternately formed over the substrate of the cell region. Each of the interlayer dielectric patterns and the first conductive patterns includes a horizontal part extending along a surface of the substrate and a vertical part extending along a sidewall of the first insulation layer.

13 Claims, 12 Drawing Sheets

NON-VOLATILE MEMORY DEVICE AND METHOD FOR FABRICATING THE SAME

CROSS-REFERENCE TO RELATED APPLICATIONS

The present application claims priority of Korean Patent Application No. 10-2011-0044147, filed on May 11, 2011, which is incorporated herein by reference in its entirety.

BACKGROUND

1. Field

Exemplary embodiments of the present invention relate to a non-volatile memory device and a method for fabricating the same, and more particularly, to a non-volatile memory device with a three-dimensional structure, in which a plurality of memory cells are vertically stacked on a substrate, and a method for fabricating the same.

2. Description of the Related Art

A non-volatile memory device refers to a memory device which is capable of maintaining stored data without a power supply. A variety of non-volatile memory devices, such as flash memories have been extensively used.

Meanwhile, as higher integration of a memory device having a two-dimensional structure, in which memory cells are formed as a single layer on a silicon substrate, has reached physical limits, there is being developed a non-volatile memory device having a three-dimensional structure, in which a plurality of memory cells are vertically stacked on a silicon substrate. In more detail, a non-volatile memory device with a three-dimensional structure includes pillar-shaped channels protruding upward from a substrate and a plurality of interlayer dielectric layers and a plurality of gate electrode layers alternately stacked while surrounding the pillar-shaped channels.

In such a structure, in order to apply a power supply to each gate electrode layer, the ends of the plurality of interlayer dielectric layers and the plurality of gate electrode layers alternately stacked are formed in a stepped shape by an etching process, and contacts are formed at the ends of the respective gate electrode layers.

However, since the etching process is performed by forming a photoresist pattern on the plurality of interlayer dielectric layers and the plurality of gate electrode layers alternately stacked and etching the stacked structure even though the width of the photoresist pattern, i.e., an etching mask, decreases, the process is difficult to achieve. For example, an initially used photoresist pattern is to be very thick and the stacked structure is likely to be damaged in the etching process.

Moreover, the contact forming process may not be properly performed because the heights of the respective gate electrode layers are different from one another. For example, when forming contact holes for exposing the ends of the gate electrode layers, the gate electrode layer at the top may be perforated due to a long exposure to etching gas, but the gate electrode layer at the bottom may not be exposed.

SUMMARY

An embodiment of the present invention is directed to a non-volatile memory device and a method for fabricating the same, which may facilitate and simplify the fabrication processes.

In accordance with an embodiment of the present invention, a non-volatile memory device includes: a substrate including a cell region and a peripheral circuit region; a first insulation layer formed over the substrate to cover the peripheral circuit region thereof; and interlayer dielectric patterns and first conductive patterns alternately formed over the substrate of the cell region, wherein each of the interlayer dielectric patterns and the first conductive patterns includes a horizontal part extending along a surface of the substrate and a vertical part extending along a sidewall of the first insulation layer.

In accordance with another embodiment of the present invention, a method for fabricating a non-volatile memory device includes: forming a first insulation layer over a substrate to cover a peripheral circuit region of the substrate; alternately forming interlayer dielectric layers and first conductive layers along surfaces of the substrate and the first insulation layer; and forming interlayer dielectric patterns and first conductive patterns extending in a cell region of the substrate and along the surface of the substrate and a sidewall of the first insulation layer by removing the interlayer dielectric layers and the first conductive layers of the peripheral circuit region.

In accordance with another embodiment of the present invention, a method for fabricating a non-volatile memory device includes: forming a first insulation layer over a substrate to cover a peripheral circuit region of the substrate; alternately forming interlayer dielectric layers and sacrificial layers along surfaces of the substrate and the first insulation layer; forming interlayer dielectric patterns and sacrificial patterns extending in a cell region of the substrate and along the surface of the substrate and a sidewall of the first insulation layer by removing the interlayer dielectric layers and the sacrificial layers of the peripheral circuit region; removing the sacrificial patterns; and forming first conductive patterns to be filled in a space obtained by removing the sacrificial patterns.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1A:
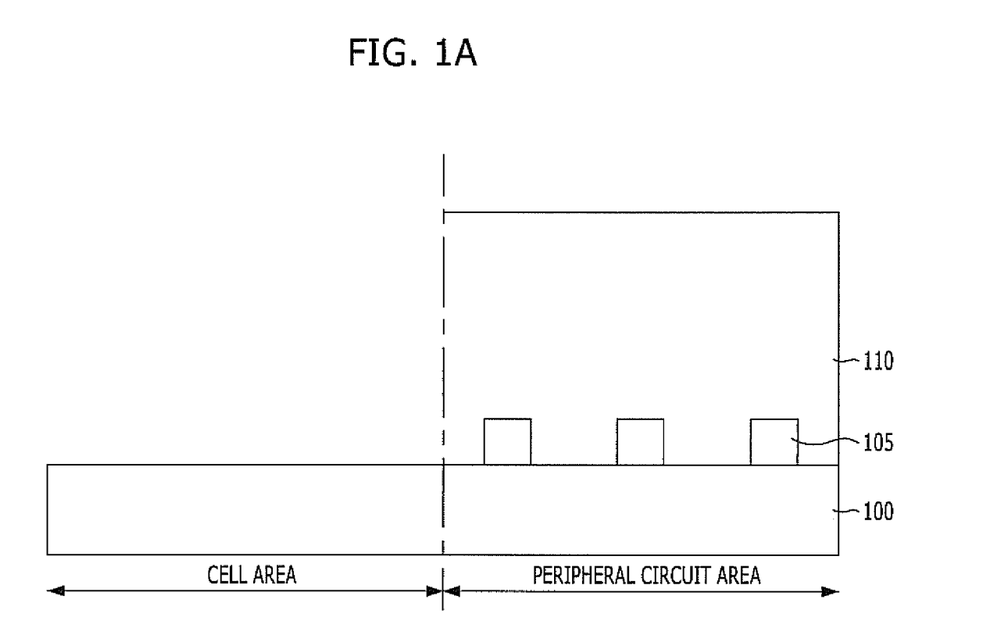
FIGS. 1A to 1G are diagrams illustrating a non-volatile memory device and a method for fabricating the same in accordance with a first embodiment of the present invention.
Figure 1B:
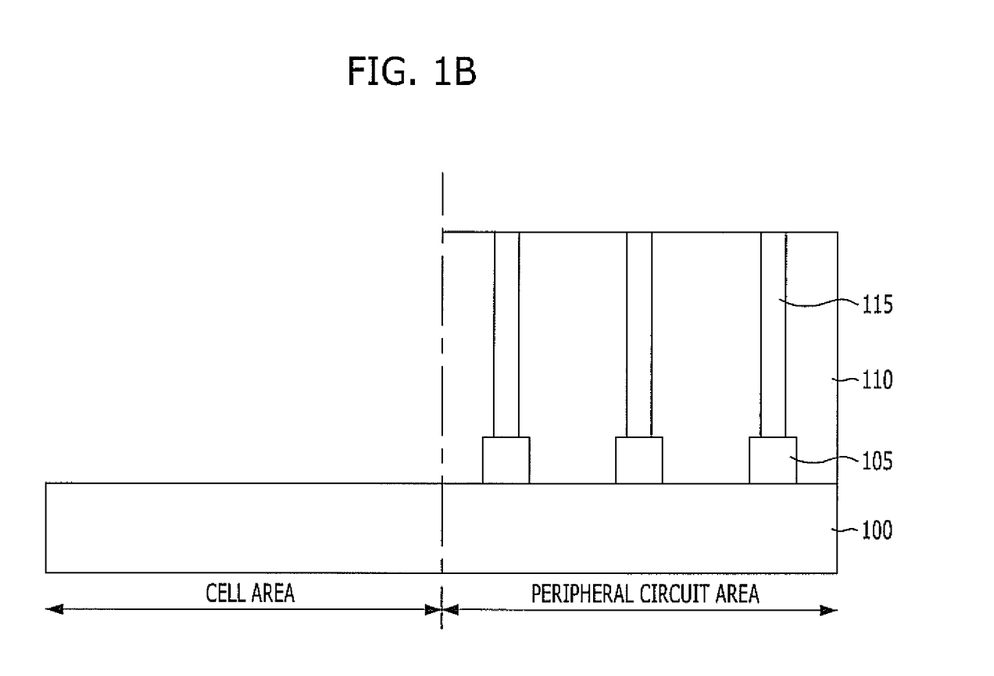
Figure 1C:
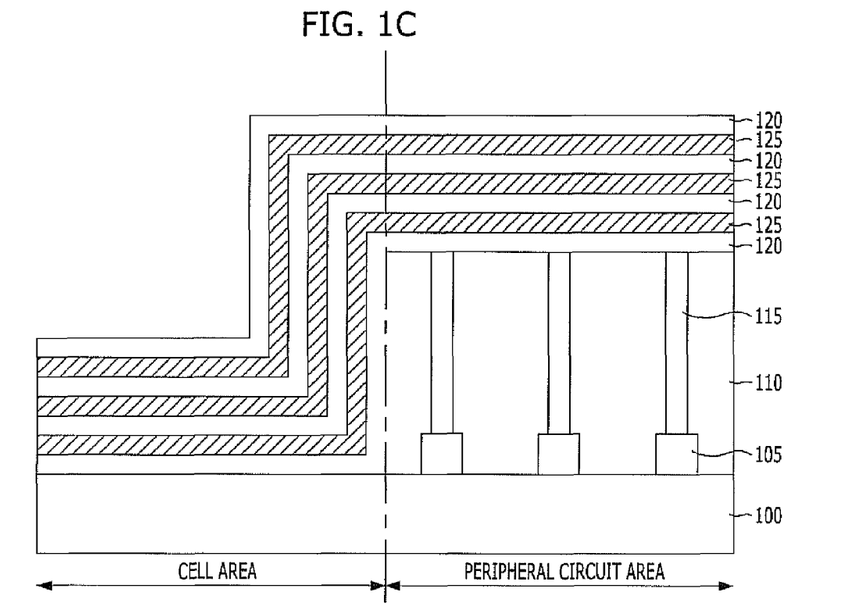
Figure 1D:
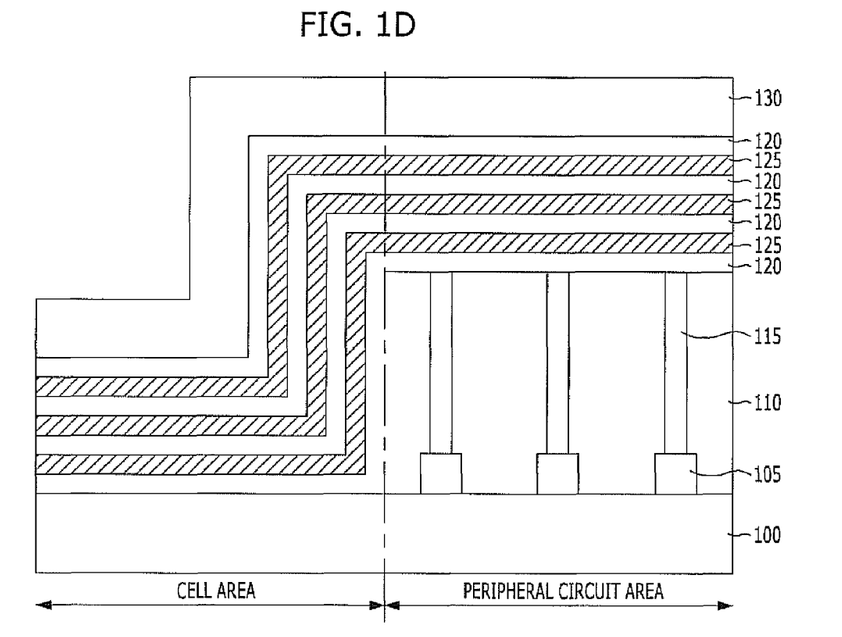
Figure 1E:
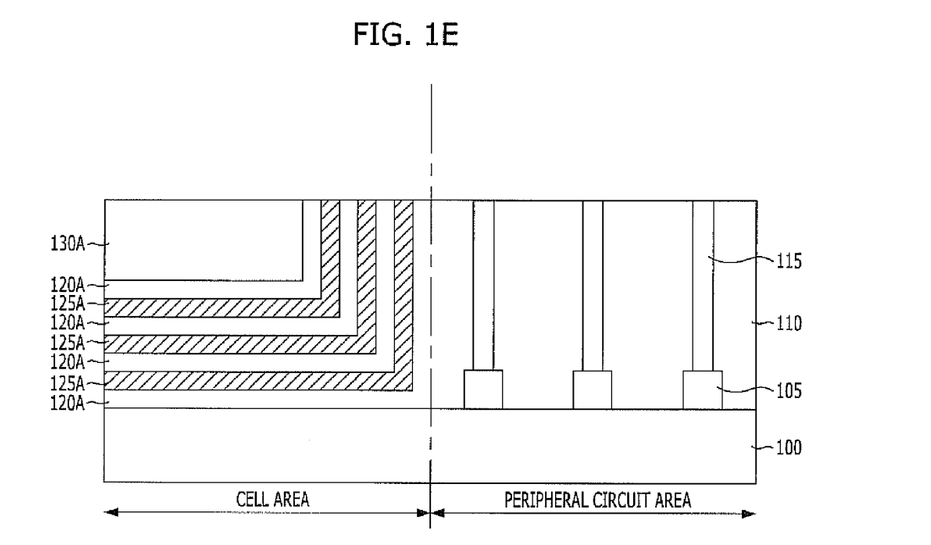
Figure 1F:
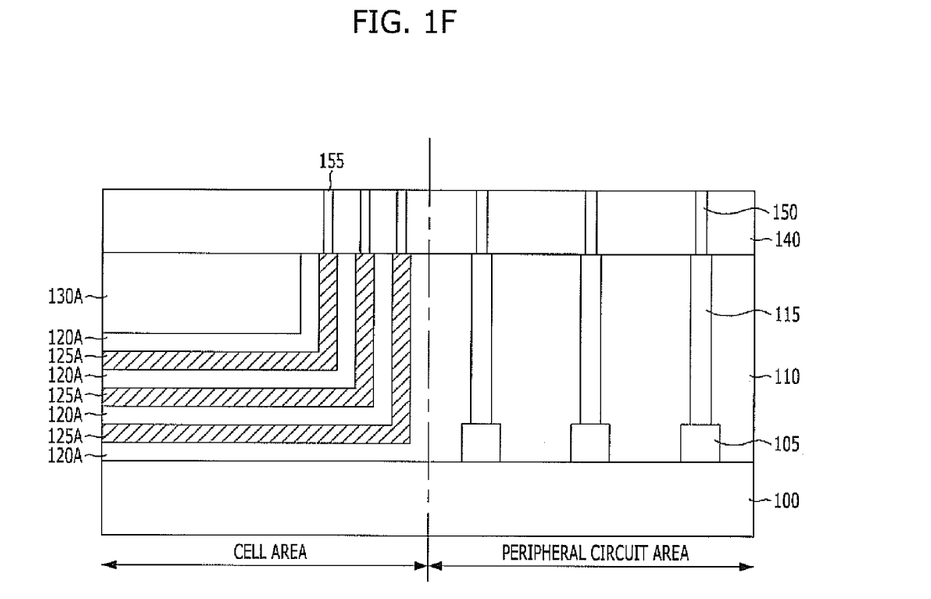
Figure 1G:
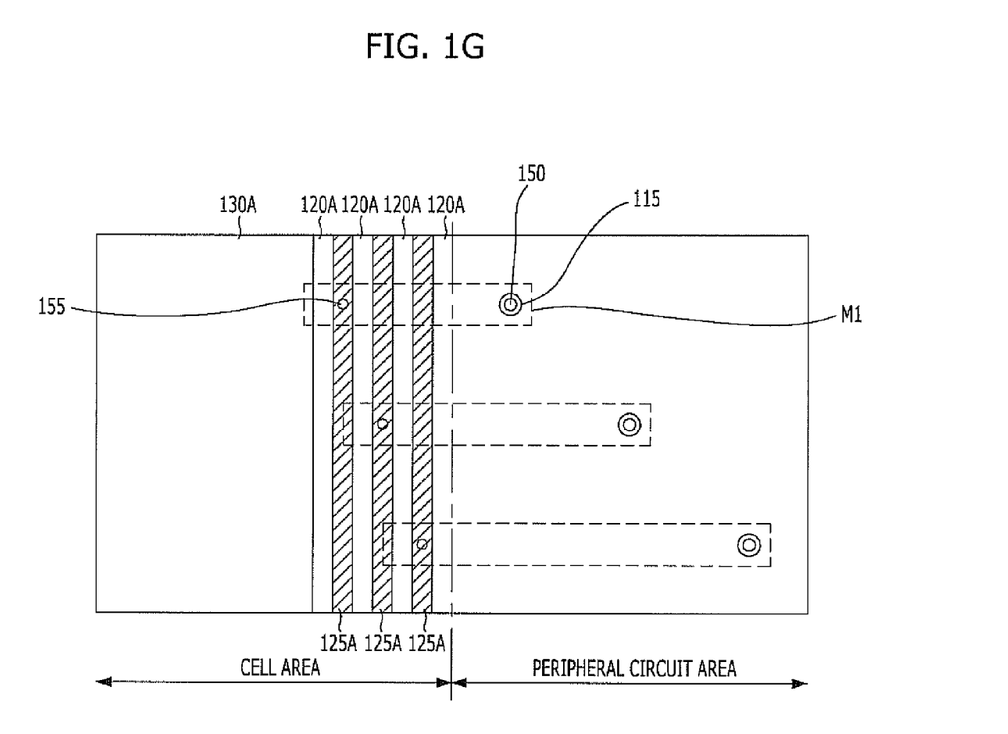

FIGS. 1A to 1G are diagrams illustrating a non-volatile memory device and a method for fabricating the same in accordance with a first embodiment of the present invention. Specifically, FIGS. 1F and 1G are a cross-sectional view and a plan view illustrating the non-volatile memory device in accordance with the first embodiment of the present invention, and FIGS. 1A and 1E are cross-sectional views illustrating intermediate processes for fabricating the non-volatile memory device illustrated in FIGS. 1F and 1G.

Referring to FIG. 1A, a substrate 100 has a cell region and a peripheral circuit region. The substrate 100 may include a semiconductor substrate such as a silicon substrate. On the substrate 100 of the peripheral circuit region, peripheral circuit gates 105 may be arranged as peripheral circuit elements.

A first insulation layer 110 is formed on the substrate 100 to cover the peripheral circuit region. The first insulation layer 110 may include an oxide layer.

Referring to FIG. 1B, first contacts 115 connected to the peripheral circuit gates 105 are formed to penetrate through the first insulation layer 110 as connection parts between the peripheral circuit elements and the other elements.

The first contacts 115 may be formed by selectively etching the first insulation layer 110 to form contact holes for exposing the peripheral circuit elements to be connected to the other elements, for example, the peripheral circuit gates 105, and filling a conductive material (for example, a metal material) in the contact holes.

Referring to FIG. 1C, interlayer dielectric layers 120 and first conductive layers 125 are alternately formed along the entire surface of a resultant structure including the first insulation layer 110 and the first contacts 115.

The first conductive layers 125 are used as control gate electrodes of a plurality of memory cells in the non-volatile memory device of the present embodiment and, for example, may include polysilicon. The interlayer dielectric layers 120 isolate the first conductive layers 125 from one another and may include an oxide layer.

In the present embodiment, the first conductive layers 125 of three layers are illustrated. However the present invention is not limited thereto. For example, the number of the first conductive layers 125 to be stacked may be variously changed.

As a result, each of the first conductive layers 125 and the interlayer dielectric layers 120 includes a first part arranged on the substrate 100 of the cell region and extending in the horizontal direction, a second part extending in the vertical direction along the sidewall of the first insulation layer 110 formed the peripheral circuit region, and a third part arranged on the first insulation layer 110 of the peripheral circuit region and extending in the horizontal direction.

Referring to FIG. 1D, a protective layer 130 is formed on the uppermost interlayer dielectric layer 120 to protect the first conductive layers 125 and the interlayer dielectric layers 120 of the cell region in a subsequent planarization process.

The protective layer 130 may include an insulation material such as a spin-on dielectric (SOD) layer.

Referring to FIG. 1E, a planarization process is performed such that the first insulation layer 110 and the first contacts 115 are exposed. The planarization process may be performed using a polishing process such as a chemical mechanical polishing (CMP) process.

As a result, the interlayer dielectric layers 120, the first conductive layers 125, and the protective layer 130 are removed from the peripheral circuit region and remain only in the cell region. The interlayer dielectric layers 120, the first conductive layers 125, and the protective layer 130 remaining in the cell region will be referred to as interlayer dielectric patterns 120A, first conductive patterns 125A, and a protective pattern 130A, respectively.

Each of the interlayer dielectric pattern 120A and the first conductive pattern 125A includes a part (hereinafter, referred to as a horizontal part) extending in the horizontal direction along the surface of the substrate 100 and a part (hereinafter, referred to as a vertical part) extending in the vertical direction along the sidewall of the first insulation layer 110, wherein the horizontal part and the vertical part are arranged on the substrate 100 of the cell region.

The surface of the vertical part of the interlayer dielectric pattern 120A and the surface of the vertical part of the first conductive pattern 125A have the substantially same level, and they have the substantially same level as the surfaces of the first insulation layer 110 and the first contacts 115. That is, the surface of the vertical part of the first conductive pattern 125A is exposed.

Referring to FIG. 1F, a second insulation layer 140 is formed on a resultant structure obtained through the process of FIG. 1E. The second insulation layer 140 may include an oxide layer.

Second contacts 155 are formed to penetrate through the second insulation layer 140 of the cell region to be connected to the vertical parts of the first conductive patterns 125A, and third contacts 150 are formed to penetrate through the second insulation layer 140 of the peripheral circuit region to be connected to the first contacts 115.

The second contacts 155 and the third contacts 150 may be formed by selectively etching the second insulation layer 140 to form contact holes, which expose the vertical parts of the first conductive patterns 125A of the cell region and the first contacts 115 of the peripheral circuit region, and filling a conductive material (for example, a metal material) in the contact holes.

Referring to FIG. 1G, desired interconnection lines may be formed on the second insulation layer 140 (not shown in FIG. 1G) through a subsequent process to be connected to the second contacts 155 or the third contacts 150.

For example, when the first conductive patterns 125A are respectively connected to peripheral circuit elements (for example, the peripheral circuit gates 105) of the peripheral circuit region, the second contacts 155 respectively connected to the first conductive patterns 125A may be substantially connected to the third contacts 150 connected to the respective peripheral circuit gates 105 through the first contacts 115. To this end, metal interconnection lines (refer to M1 of FIG. 1G) for connecting the second contacts 155 to the third contacts 150, which correspond to each other, may be formed on the second insulation layer 140.

Although not described in the present embodiment, the fabricating method may further include a process of forming a channel connected to the substrate 100 of the cell region and penetrating through the horizontal parts of the interlayer dielectric patterns 120A and the first conductive patterns 125A and forming a memory layer surrounding the channel. In detail, the channel and the memory layer may be formed by selectively etching the horizontal parts of the interlayer dielectric patterns 120A and the first conductive patterns 125A to form channel holes for exposing the substrate 100 of the cell region, forming a memory layer (for example, an oxide-nitride-oxide (ONO) layer) on the sidewalls of the channel holes, and filling a channel material in the channel holes in which the memory layer is formed.

According to the non-volatile memory device and the method for fabricating the same in accordance with the first embodiment of the present invention as described above, since all the surfaces of the vertical parts of the first conductive patterns 125A are exposed on the horizontal surface of the resultant structure to provide regions where contacts are to be formed, an additional etching process of allowing the end of the first conductive patterns 125A to have a stepped shape in the conventional art may not be performed.

Moreover, since the surfaces of the vertical parts of the first conductive patterns 125A have the same level, a process of forming the second contacts 155 connected to the first conductive patterns 125A may be performed.

In addition, since the first contacts 115 are formed in advance in the first insulation layer 110 arranged in the peripheral circuit region, only the third contacts 150 having a low aspect ratio are to be formed so as to be connected to the previously formed first contacts 115 and form the contacts connected to peripheral circuit elements. Specifically, since the process of forming the third contacts 150 may be performed simultaneously with the process of forming the second contacts 155, the fabrication processes may be facilitated and simplified.

Figure 2A:
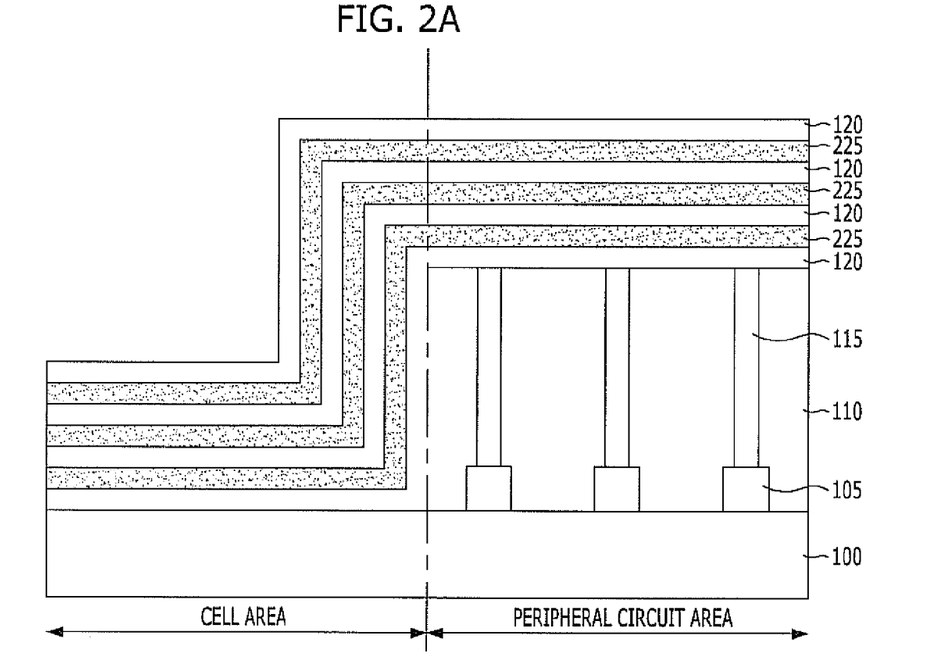
FIGS. 2A to 2C are diagrams illustrating a non-volatile memory device and a method for fabricating the same in accordance with a second embodiment of the present invention.
Figure 2B:
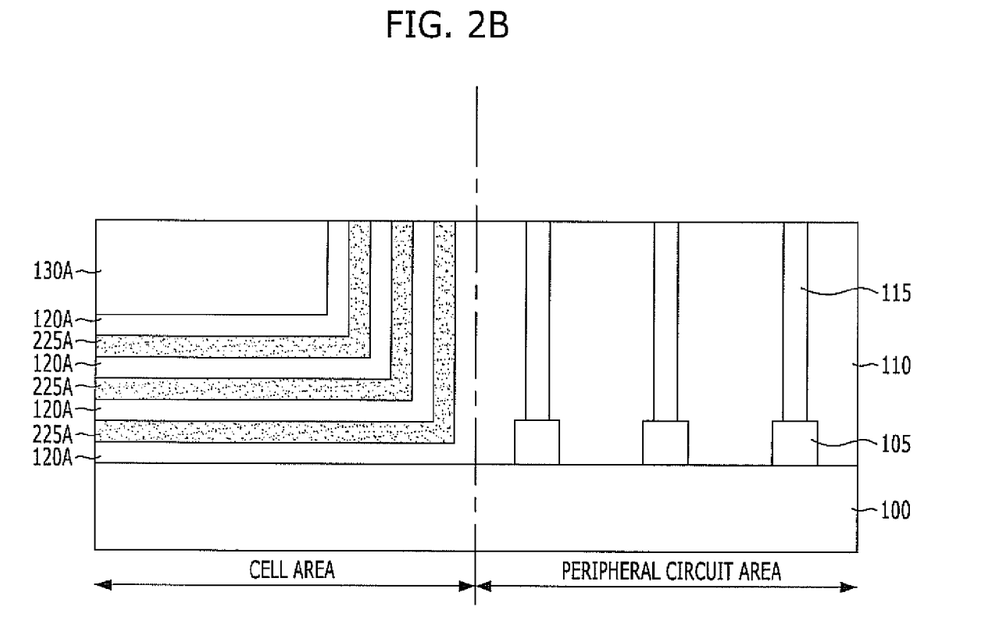
Figure 2C:
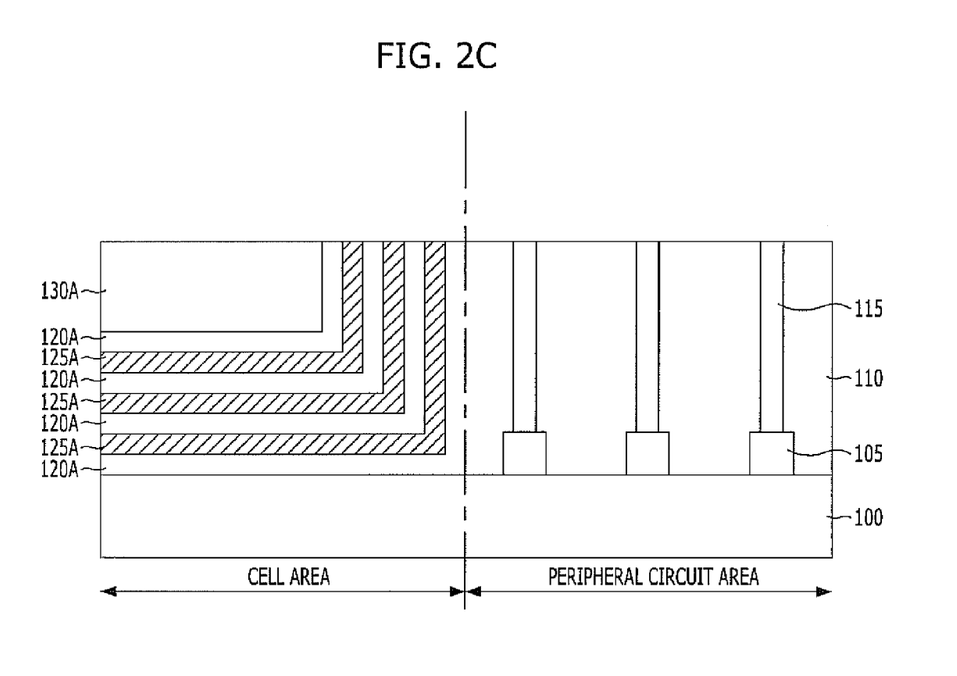

FIGS. 2A to 2C are diagrams illustrating a non-volatile memory device and a method for fabricating the same in accordance with a second embodiment of the present invention. In the following description, detailed description substantially the same as that of the first embodiment will be omitted.

Referring to FIG. 2A, similarly to the first embodiment, a substrate 100 has a cell region and a peripheral circuit region, peripheral circuit gates 105 are formed on the substrate 100 of the peripheral circuit region, a first insulation layer 110 is formed to cover the peripheral circuit region, and first contacts 115 are formed to be connected to the peripheral circuit gates 105 by penetrating through the first insulation layer 110.

Interlayer dielectric layers 120 and sacrificial layers 225 are alternately formed along the entire surface of a resultant structure including the first insulation layer 110 and the first contacts 115.

The sacrificial layers 225 provide a space where control gate electrodes of memory cells are to be formed, which will be described hereafter, and may include a material having an etching rate different from that of the interlayer dielectric layer 120 (for example, a nitride layer). The interlayer dielectric layer 120 isolates the sacrificial layers 225 from each other and, for example, may include an oxide layer.

Referring to FIG. 2B, a protective layer is formed on the uppermost interlayer dielectric layer 120, and a planarization process is performed until the first insulation layer 110 and the first contacts 115 are exposed.

As a result, interlayer dielectric patterns 120A, sacrificial patterns 225A, and a protective pattern 130A are formed on the cell region. Similarly to the first embodiment, each of the interlayer dielectric pattern 120A and the sacrificial pattern 225A includes a horizontal part extending in the horizontal direction along the surface of the substrate 100 and a vertical part extending in the vertical direction along the sidewall of the first insulation layer 110, wherein the horizontal part and the vertical part are arranged on the substrate 100 of the cell region. Thus, the surfaces of the vertical parts of the sacrificial patterns 225A are exposed.

Referring to FIG. 2C, the exposed sacrificial patterns 225A are removed and then a conductive material, for example, polysilicon or a metal material such as tungsten, is filled in a space obtained by removing the sacrificial patterns 225A, thereby forming first conductive patterns 125A used as gate electrodes.

The sacrificial patterns 225A, for example, may be removed using a wet etch process.

Subsequent processes are performed similarly to the first embodiment. That is, the processes of FIGS. 1F and 1G may be performed.

The second embodiment as described above is substantially the same as the first embodiment, except that a space where the conductive patterns used as the gate electrodes are to be formed is provided using the sacrificial patterns.

FIGS. 3A to 3D are diagrams illustrating a non-volatile memory device and a method for fabricating the same in accordance with a third embodiment of the present invention. In the following description, detailed description substantially the same as that of the first embodiment will be omitted.

Figure 3A:
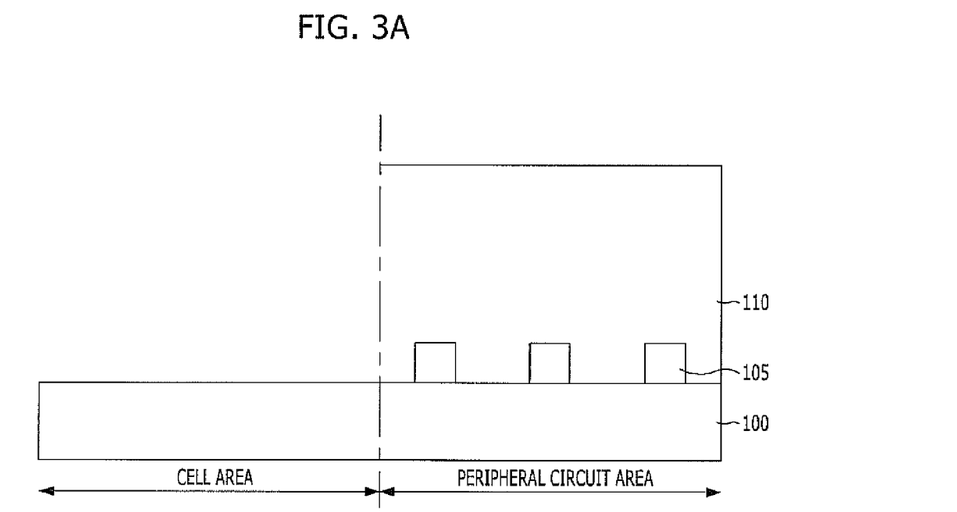
FIGS. 3A to 3D are diagrams illustrating a non-volatile memory device and a method for fabricating the same in accordance with a third embodiment of the present invention.

Referring to FIG. 3A, similarly to the first embodiment, a substrate 100 has a cell region and a peripheral circuit region, peripheral circuit gates 105 are formed on the substrate 100 of the peripheral circuit region, and a first insulation layer 110 is formed to cover the peripheral circuit region.

Figure 3B:
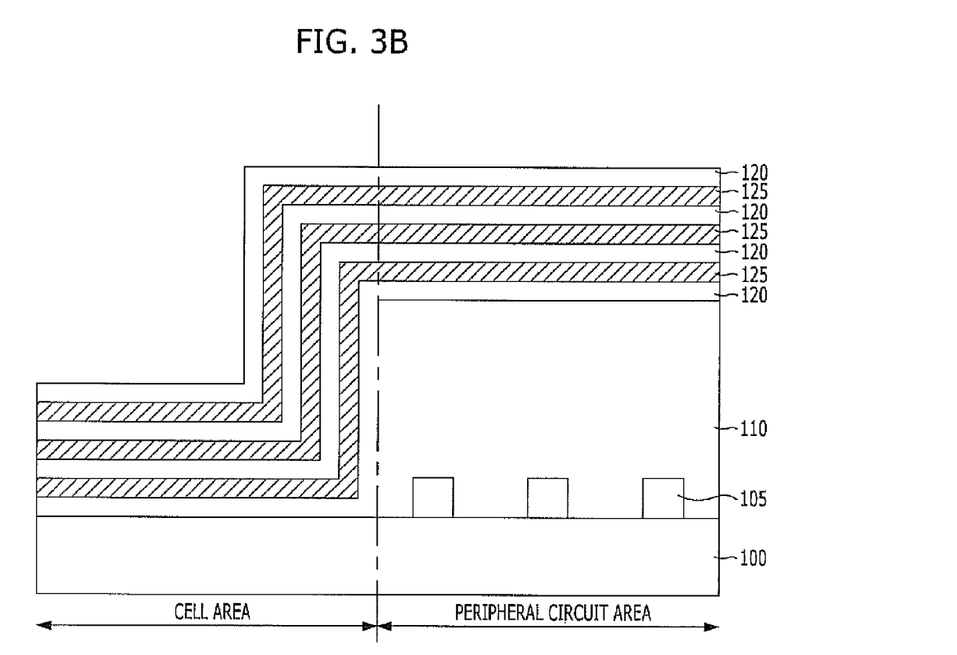

Referring to FIG. 3B, interlayer dielectric layers 120 and first conductive layers 125 are alternately formed along the entire surface of a resultant structure including the first insulation layer 110.

Figure 3C:
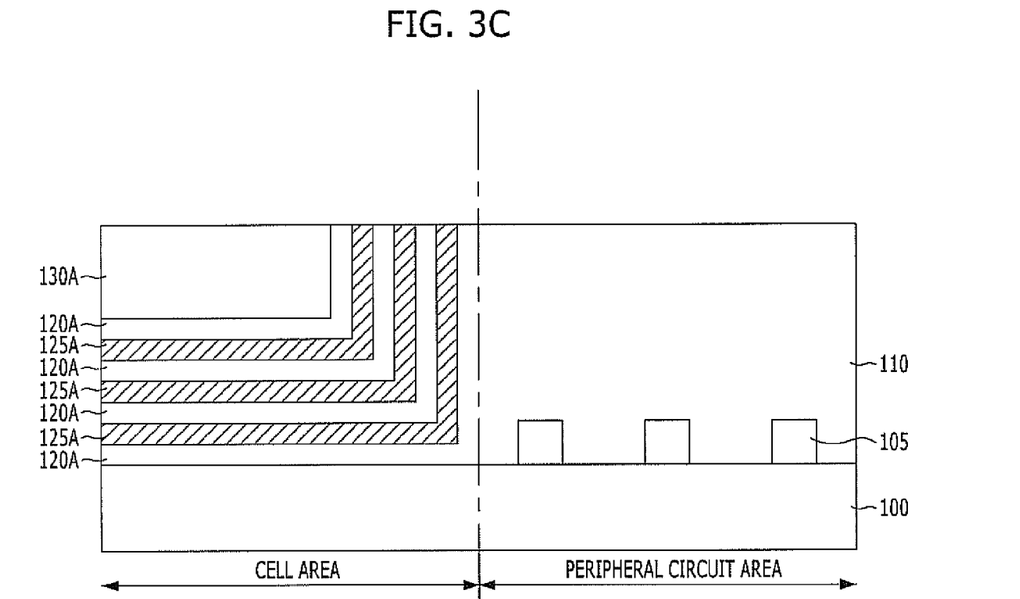

Referring to FIG. 3C, a protective layer is formed on the uppermost interlayer dielectric layer 120, and a planarization process is performed until the first insulation layer 110 is exposed.

As a result, interlayer dielectric patterns 120A, first conductive patterns 125A, and a protective pattern 130A are formed on the cell region. Similarly to the first embodiment, each of the interlayer dielectric pattern 120A and the first conductive pattern 125A includes a horizontal part extending in the horizontal direction along the surface of the substrate 100 and a vertical part extending in the vertical direction along the sidewall of the first insulation layer 110, wherein the horizontal part and the vertical part are arranged on the substrate 100 of the cell region.

Figure 3D:
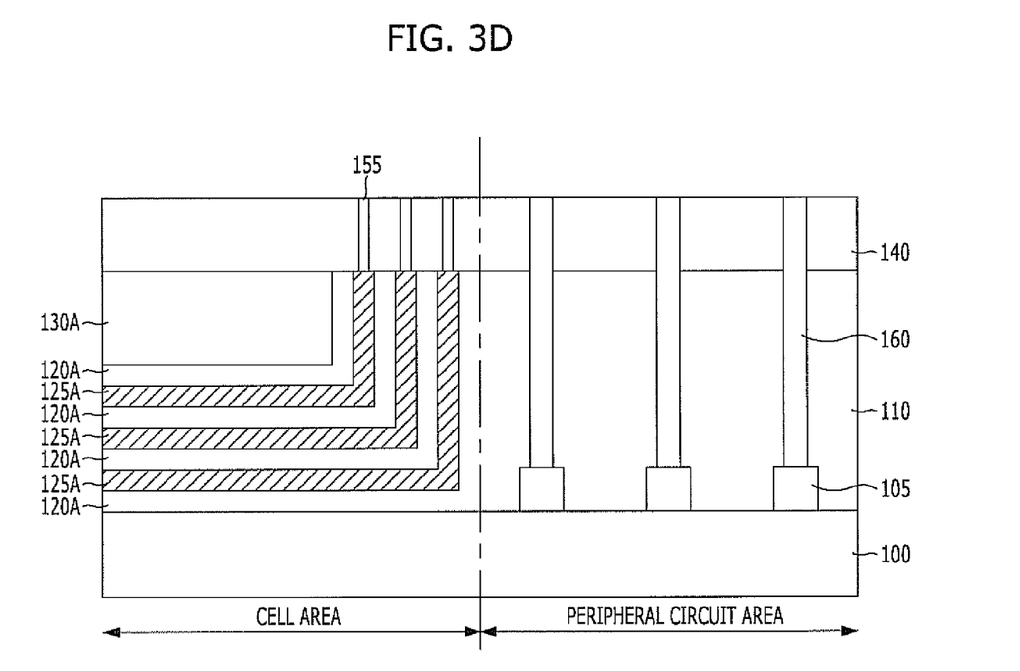

Referring to FIG. 3D, a second insulation layer 140 is formed on a resultant structure obtained through the process of FIG. 3C.

Second contacts 155 are formed to penetrate through the second insulation layer 140 of the cell region and be connected to the vertical parts of the first conductive patterns 125A, and fourth contacts 160 are formed to penetrate through the second insulation layer 140 and the first insulation layer 110 of the peripheral circuit region and be connected to the peripheral circuit gates 105.

That is, the third embodiment is substantially the same as the first embodiment, except that the contacts of the peripheral circuit region are subsequently formed so as to be connected to the peripheral circuit elements.

Meanwhile, the above-mentioned process of the non-volatile memory device of the present embodiment may further include a process of forming a channel or a memory layer of the non-volatile memory device and a process of forming a select transistor arranged on a structure in which interlayer dielectric layers and conductive layers are stacked. This will be described with reference to FIGS. 4A to 4H.

FIGS. 4A to 4H are diagrams illustrating a non-volatile memory device and a method for fabricating the same in accordance with a fourth embodiment of the present invention.

Figure 4A:
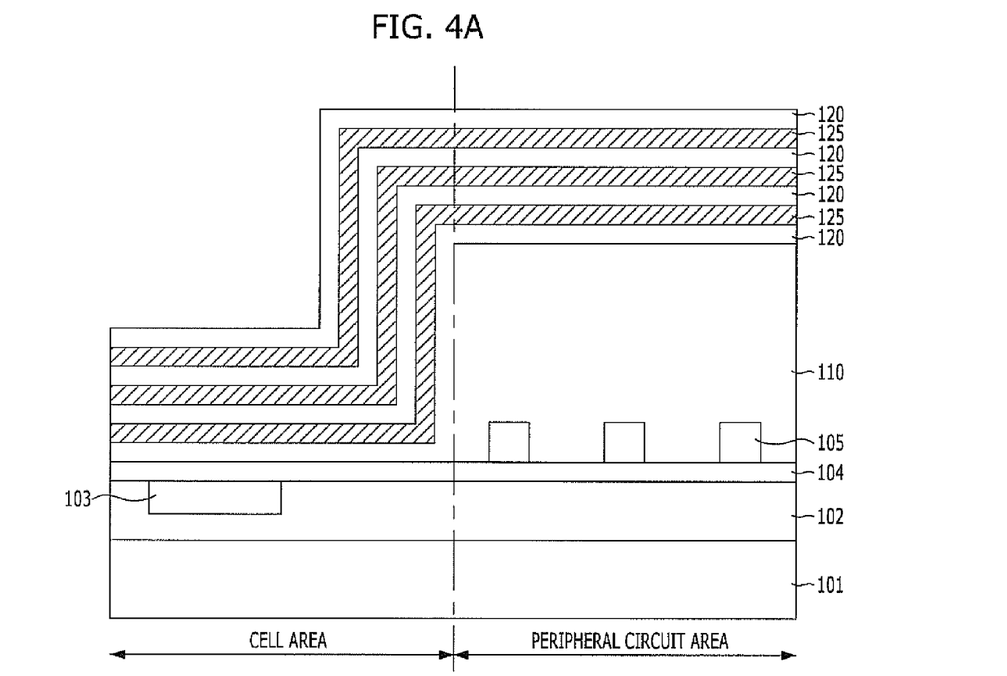
FIGS. 4A to 4H are diagrams illustrating a non-volatile memory device and a method for fabricating the same in accordance with a fourth embodiment of the present invention.

Referring to FIG. 4A, a second conductive layer 102 is formed on a substrate 101 including a peripheral circuit region and a cell region in order to form a gate electrode of a pipe channel transistor. The substrate 101 may include a semiconductor substrate and may be provided with an insulation layer on the uppermost portion thereof. The second conductive layer 102, for example, may include polysilicon.

The second conductive layer 102 is patterned to form a space where a pipe channel is to be formed, and a first insulation pattern 103 is filled in the space. The first insulation pattern 103 may include a nitride layer.

A second insulation layer 104 is formed on the second conductive layer 102 including the first insulation pattern 103. The second insulation layer 104, for example, may include a nitride layer.

Peripheral circuit gates 105 are formed on the second insulation layer 104 of the peripheral circuit region as peripheral circuit elements, and a first insulation layer 110 is formed to cover the peripheral circuit region.

Interlayer dielectric layers 120 and first conductive layers 125 are alternately formed along the entire surface of a resultant structure including the first insulation layer 110.

Figure 4B:
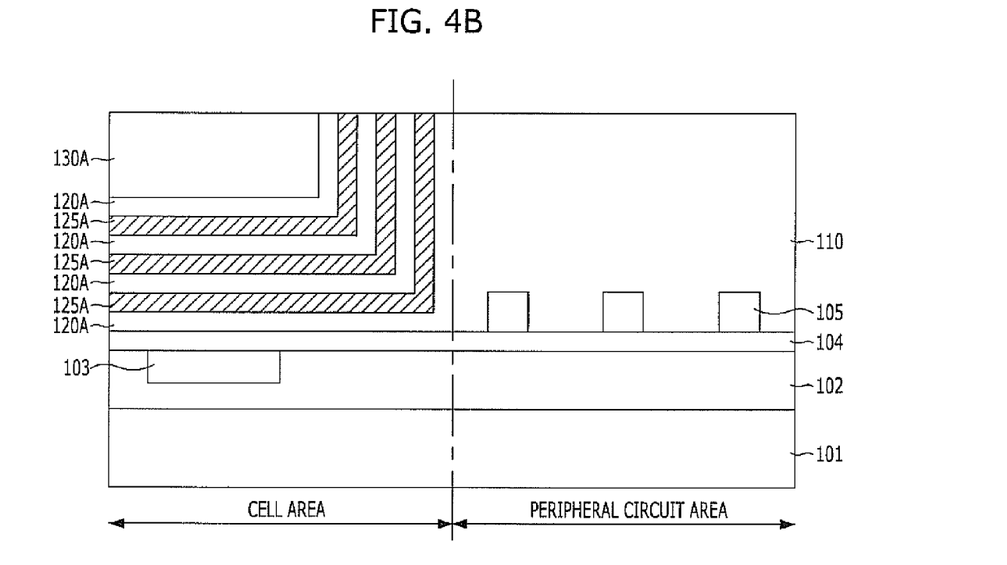

Referring to FIG. 4B, a protective layer is formed on the uppermost interlayer dielectric layer 120, and a planarization process is performed until the first insulation layer 110 is exposed.

As a result, interlayer dielectric patterns 120A, first conductive patterns 125A, and a protective pattern 130A are formed on the cell region. Each of the interlayer dielectric pattern 120A and the first conductive pattern 125A includes a horizontal part extending in the horizontal direction along the surface of the substrate 100 and a vertical part extending in the vertical direction along the sidewall of the first insulation layer 110, wherein the horizontal part and the vertical part are arranged on the substrate 100 of the cell region.

Figure 4C:
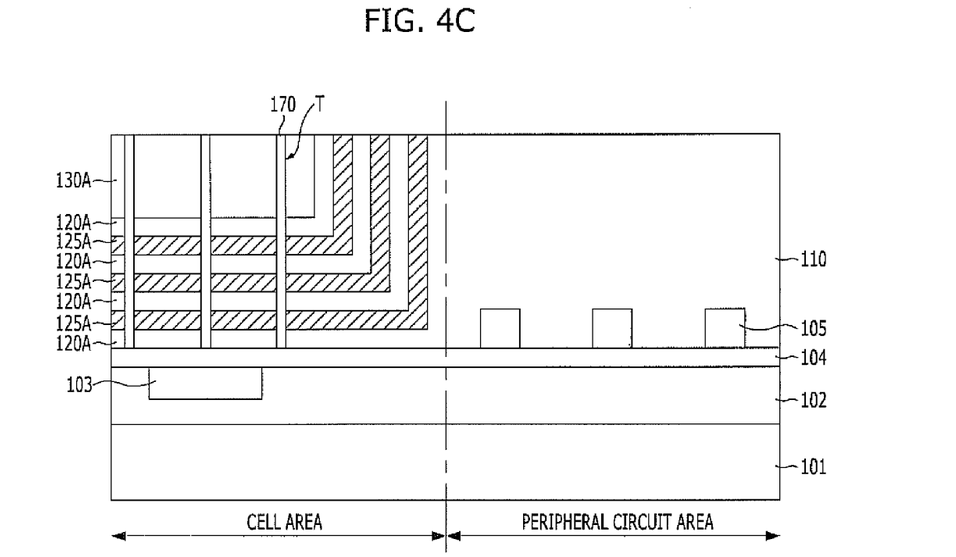

Referring to FIG. 4C, in order to isolate the first conductive patterns 125A corresponding to a channel which will be formed in subsequent process, a stack structure of the protective pattern 130A, the first conductive patterns 125A, and the interlayer dielectric patterns 120A between channel formation regions is selectively etched, thereby forming first trenches T1 extending perpendicularly to the cross-sectional direction. The first trenches T1 may be formed by performing an etching process using the second insulation layer 104 as an etch stop layer.

A third insulation layer 170 is formed to be filled in the first trenches T1.

Figure 4D:
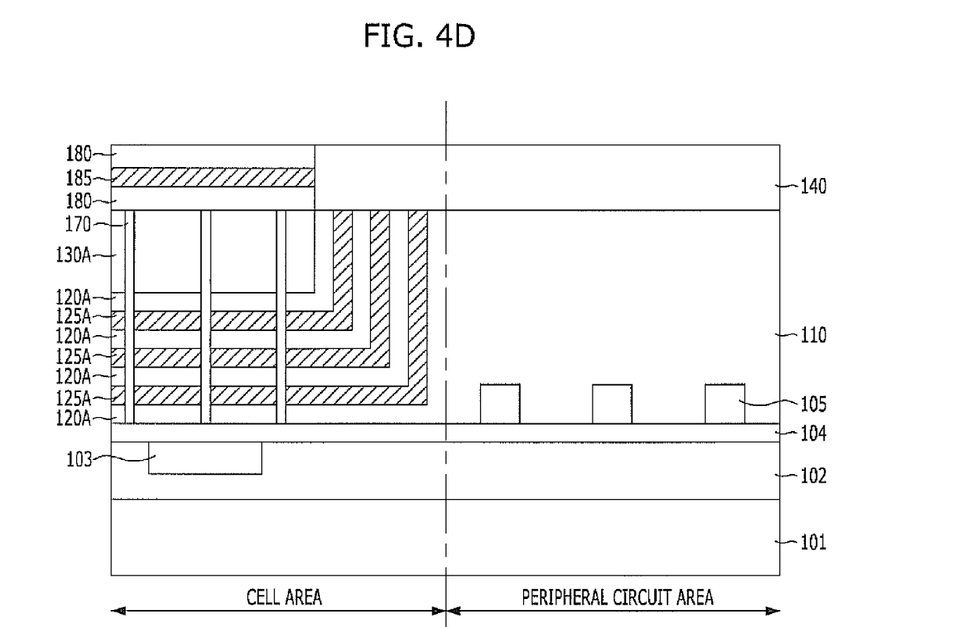

Referring to FIG. 4D, a structure, in which a second interlayer dielectric layer 180, a second conductive layer 185, and the second interlayer dielectric layer 180 are stacked, is formed on a resultant structure obtained through the process of FIG. 4C in order to form a gate electrode of a select transistor. The structure, in which the second interlayer dielectric layer 180, the second conductive layer 185, and the second interlayer dielectric layer 180 are stacked, is formed to cover horizontal parts of the first conductive pattern 125A and the interlayer dielectric pattern 120A of the cell region, other than vertical parts thereof. Furthermore, a second insulation layer 140 is arranged on the other region of the resultant structure obtained through the process of FIG. 4C, except for the region where the structure in which the second interlayer dielectric layer 180, the second conductive layer 185, and the second interlayer dielectric layer 180 are stacked.

Figure 4E:
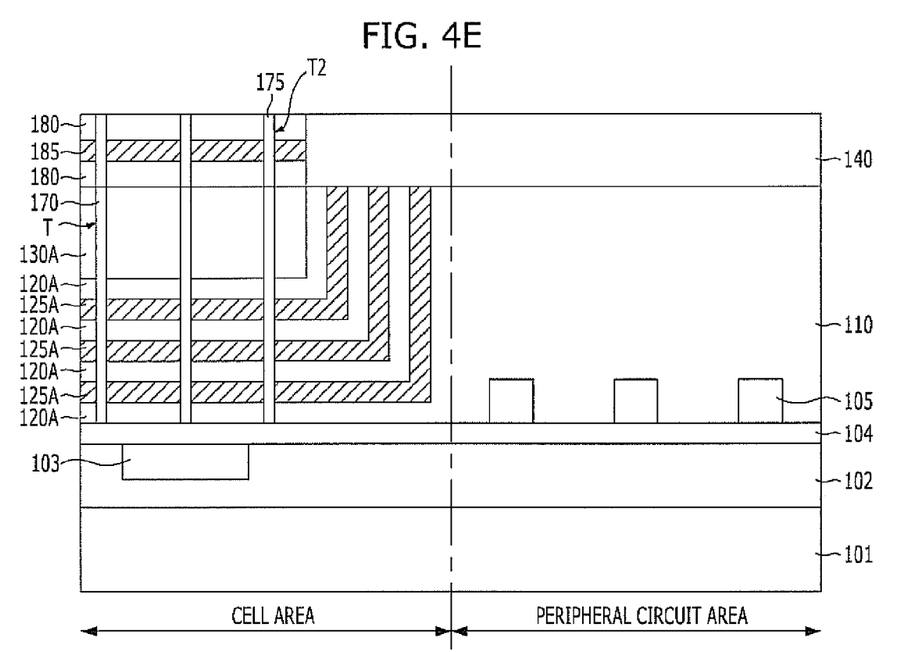

Referring to FIG. 4E, in order to isolate the second conductive layer 185 corresponding to the channel which will be formed in the subsequent process, the second interlayer dielectric layer 180, the second conductive layer 185, and the second interlayer dielectric layer 180 between channel formation regions are selectively etched, thereby forming second trenches T2 for exposing the third insulation layer 170.

A fourth insulation layer 175 is formed to be filled in the second trenches T2.

Figure 4F:
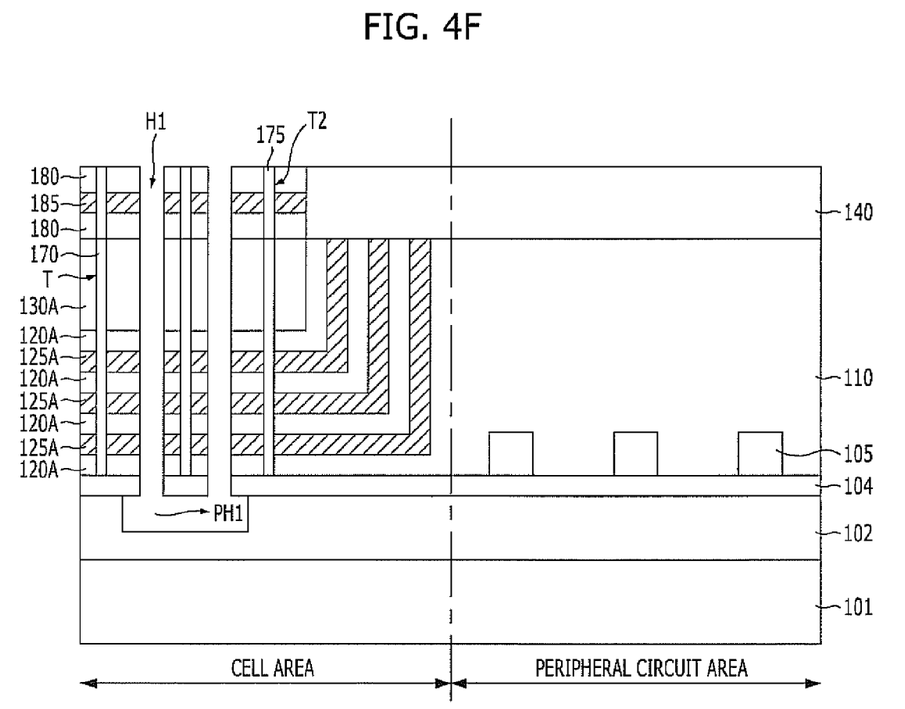

Referring to FIG. 4F, in order to form the above-mentioned channel, the structure of the cell region is selectively etched to form a pair of channel holes H1 for exposing the first insulation pattern 103. The first insulation pattern 103 exposed through the channel holes H1 is removed using a wet etch process and the like, thereby forming a pipe channel hole PH1.

Figure 4G:
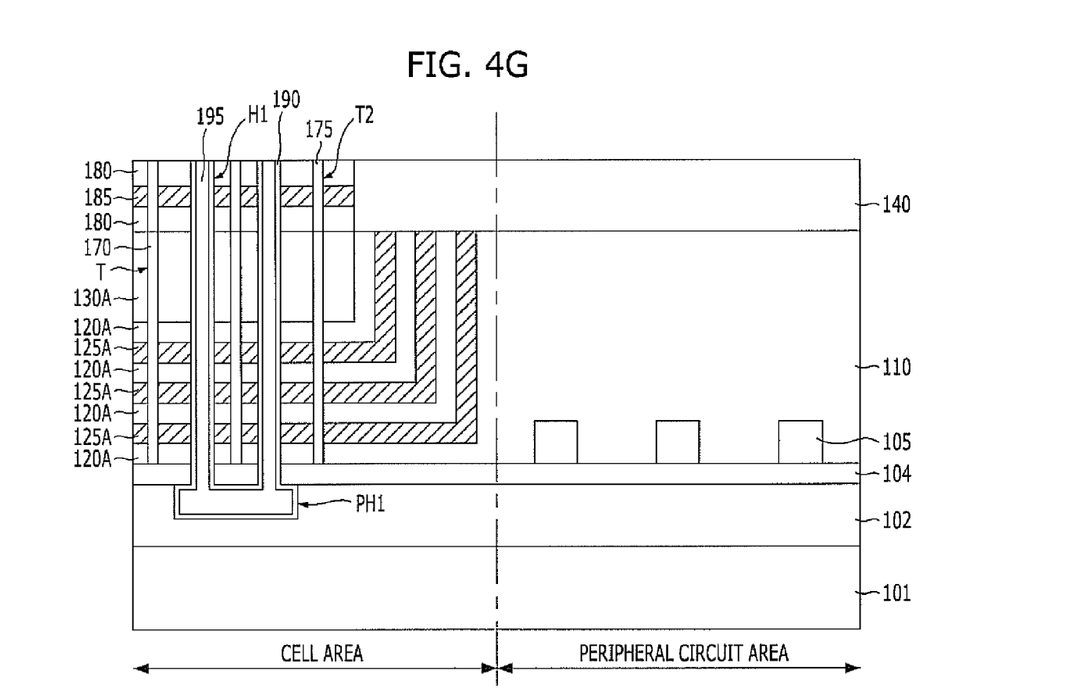

Referring to FIG. 4G, a charge blocking layer, a charge trap layer, and a tunnel insulation layer are sequentially deposited on the inner walls of the channel holes H1 and the pipe channel hole PH1 to form a memory layer 190, and a channel 195 is formed to be filled in the channel holes H1 and the pipe channel hole PH1.

Figure 4H:
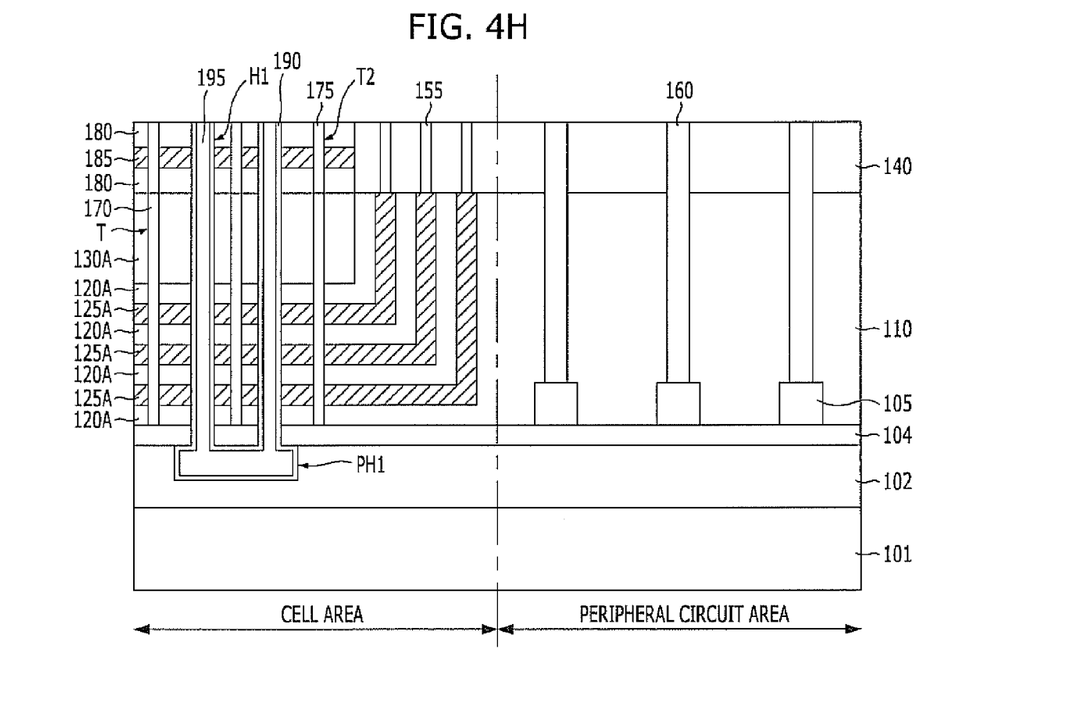

Referring to FIG. 4H, second contacts 155 are formed to be connected to the vertical parts of the first conductive pattern 125A by penetrating through the second insulation layer 140 of the cell region, and fourth contacts 160 are formed by penetrating through the second insulation layer 140 and the first insulation layer 110 of the peripheral circuit region to be connected to the peripheral circuit gates 105.

In the fourth embodiment, a non-volatile memory device with a three-dimensional structure including a pipe channel transistor is described. However, the present invention is not limited thereto. The fourth embodiment is only an example of a non-volatile memory device having a three-dimensional structure. The present invention may be applied to all non-volatile memory devices having a three-dimensional structure, that is, all non-volatile memory devices having a structure in which a channel protrudes from a substrate and interlayer dielectric layers and conductive layers are alternately stacked along the channel.

According to the non-volatile memory device and the method for fabricating the same in accordance with the present invention, the fabrication processes may be facilitated and simplified.

While the present invention has been described with respect to the specific embodiments, it will be apparent to those skilled in the art that various changes and modifications may be made without departing from the spirit and scope of the invention as defined in the following claims.

What is claimed is:
1. A non-volatile memory device comprising:
a substrate including a cell region and a peripheral circuit region;
a first insulation layer formed over the substrate to cover the peripheral circuit region thereof;
interlayer dielectric patterns and first conductive patterns alternately formed over the substrate of the cell region, wherein each of the interlayer dielectric patterns and the first conductive patterns includes a horizontal part extending along a surface of the substrate and a vertical part extending along a sidewall of the first insulation layer;
a first contact connected to the substrate of the peripheral circuit region and penetrating through the first insulation layer;
a second insulation layer formed over the first insulation layer, the interlayer dielectric patterns, and the first conductive patterns;
a second contact connected to the vertical parts of the first conductive patterns and penetrating through the second insulation layer;

a third contact connected to the first contact and penetrating through the second insulation layer; and
an interconnection line arranged over the second insulation layer to connect the second contact to the third contact.

2. A non-volatile memory device comprising:
a substrate including a cell region and a peripheral circuit region;
a first insulation layer formed over the substrate to cover the peripheral circuit region thereof;
interlayer dielectric patterns and first conductive patterns alternately formed over the substrate of the cell region, wherein each of the interlayer dielectric patterns and the first conductive patterns includes a horizontal part extending along a surface of the substrate and a vertical part extending along a sidewall of the first insulation layer;
a second insulation layer formed over the first insulation layer, the interlayer dielectric patterns, and the first conductive patterns;
a second contact connected to the vertical parts of the first conductive patterns and penetrating through the second insulation layer; and
a fourth contact connected to the substrate of the peripheral circuit region and penetrating through the second insulation layer and the first insulation layer.

3. The non-volatile memory device of claim 2, further comprising:
an interconnection line arranged over the second insulation layer to connect the second contact to the fourth contact.

4. The non-volatile memory device of claim 2, further comprising:
a peripheral circuit gate formed over the substrate and connected between the fourth contact and the substrate.

5. A method for fabricating a non-volatile memory device, comprising:
forming a first insulation layer over a substrate to cover a peripheral circuit region of the substrate;
alternately forming interlayer dielectric layers and first conductive layers along surfaces of the substrate and the first insulation layer;
forming interlayer dielectric patterns and first conductive patterns extending in a cell region of the substrate and along the surface of the substrate and a sidewall of the first insulation layer by removing the interlayer dielectric layers and the first conductive layers of the peripheral circuit region;
forming a first contact connected to the substrate of the peripheral circuit region and penetrating through the first insulation layer;
forming a second insulation layer over a resultant structure including the interlayer dielectric patterns and the first conductive patterns;
forming a second contact connected to ends of the first conductive patterns, extending along the sidewall of the first insulation layer, by penetrating through the second insulation layer and forming a third contact connected to the first contact by penetrating through the second insulation layer; and
forming an interconnection line over the second insulation layer to connect the second contact to the third contact.

6. A method for fabricating a non-volatile memory device, comprising:
forming a first insulation layer over a substrate to cover a peripheral circuit region of the substrate;
alternately forming interlayer dielectric layers and first conductive layers along surfaces of the substrate and the first insulation layer;
forming interlayer dielectric patterns and first conductive patterns extending in a cell region of the substrate and along the surface of the substrate and a sidewall of the first insulation layer by removing the interlayer dielectric layers and the first conductive layers of the peripheral circuit region;
forming a second insulation layer over a resultant structure including the interlayer dielectric patterns and the first conductive patterns; and
forming a second contact connected to ends of the first conductive patterns, extending along the sidewall of the first insulation layer and penetrating through the second insulation layer and forming a fourth contact connected to the substrate of the peripheral circuit region and penetrating through the first insulation layer and the second insulation layer.

7. The method of claim 6, further comprising:
forming an interconnection line over the second insulation layer to connect the second contact to the fourth contact.

8. A method for fabricating a non-volatile memory device, comprising:
forming a first insulation layer over a substrate to cover a peripheral circuit region of the substrate;
alternately forming interlayer dielectric layers and sacrificial layers along surfaces of the substrate and the first insulation layer;
forming interlayer dielectric patterns and sacrificial patterns alternately extending in a cell region of the substrate and along the surface of the substrate and a sidewall of the first insulation layer by removing the interlayer dielectric layers and the sacrificial layers of the peripheral circuit region;
removing the sacrificial patterns; and
forming first conductive patterns to be filled in a space obtained by removing the sacrificial patterns.

9. The method of claim 8, after the forming of the first insulation layer, further comprising:
forming a first contact connected to the substrate of the peripheral circuit region and penetrating through the first insulation layer.

10. The method of claim 9, further comprising:
forming a second insulation layer over a resultant structure including the interlayer dielectric patterns and the first conductive patterns; and
forming a second contact connected to ends of the first conductive patterns, extending along the sidewall of the first insulation layer, and penetrating through the second insulation layer and forming a third contact connected to the first contact and penetrating through the second insulation layer.

11. The method of claim 10, further comprising:
forming an interconnection line over the second insulation layer to connect the second contact to the third contact.

12. The method of claim 8, further comprising:
forming a second insulation layer over a resultant structure including the interlayer dielectric patterns and the first conductive patterns; and
forming a second contact connected to ends of the first conductive patterns, extending along the sidewall of the first insulation layer, and penetrating through the second insulation layer and forming a fourth contact connected to the substrate of the peripheral circuit region and penetrating through the first insulation layer and the second insulation layer.

13. The method of claim 12, further comprising:
forming an interconnection line over the second insulation layer to connect the second contact to the fourth contact.

* * * * *